United States Patent [19]

Rettig et al.

[11] Patent Number: 4,924,110

[45] Date of Patent: May 8, 1990

[54] HIGH SPEED STEP GENERATOR OUTPUT CIRCUIT

[75] Inventors: John B. Rettig; Jonathan Lueker; John E. Carlson, all of Portland; Stanley P. Kaveckis, Aurora; Roy W. Lewallen, Beaverton, all of Oreg.

[73] Assignee: Tektronix, Inc., Beaverton, Oreg.

[21] Appl. No.: 241,686

[22] Filed: Sep. 8, 1988

[51] Int. Cl.$^5$ .................. H03K 4/02; H03K 5/12; H03K 5/01; H03K 17/56

[52] U.S. Cl. .................... 307/227; 307/265; 307/268; 307/243; 328/59; 328/61; 328/186

[58] Field of Search .......... 307/227, 243, 268, 317 A, 307/259, 503, 265; 328/59, 61, 186

[56] References Cited

U.S. PATENT DOCUMENTS

| | | | |
|---|---|---|---|
| 2,858,434 | 10/1958 | Tollefson | 328/186 |
| 3,215,860 | 11/1965 | Neumann | 328/186 |
| 3,356,956 | 12/1967 | Willard | 328/186 |
| 4,060,739 | 11/1977 | Russer et al. | 307/243 |
| 4,758,736 | 7/1988 | Agoston et al. | 307/243 |

Primary Examiner—Stanley D. Miller
Assistant Examiner—Trong Quang Phan
Attorney, Agent, or Firm—Peter J. Meza

[57] ABSTRACT

A step generator for producing steps having constant edge parameters while driving varying loads includes a pair of DC coupled low speed diode switches for slowly switching the output load current. A pair of capacitors provide an AC coupled high speed input for rapidly, but temporarily, switching the output load current until the sustaining action of the low speed diode switch has occurred. A pair of resistor divider circuits in each of the low speed diode switches maintains a relatively constant reverse bias voltage across the diodes coupled to the capacitors. The high speed switching threshold is maintained at a relatively constant level which produces an output voltage step with constant edge parameters and no overshoot.

7 Claims, 1 Drawing Sheet

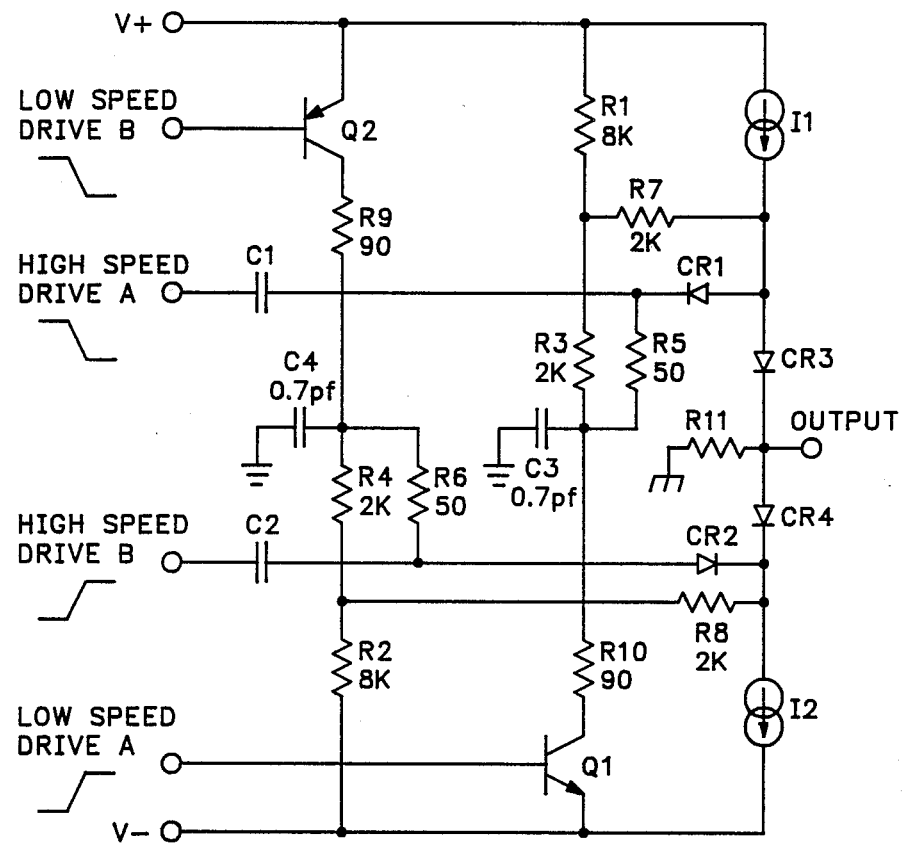

HIGH SPEED STEP GENERATOR OUTPUT CIRCUIT

BACKGROUND OF THE INVENTION

The present invention relates in general to step generators utilizing diode switches to switch load currents through a load resistor to produce a stepped output voltage, and more particularly, to step generators having constant edge parameters while driving variable loads.

One method of utilizing diode switches to switch loads currents through a load is shown in FIG. 2 of U.S. Pat. No. 4,758,736 to Agoston, et al. The circuit of FIG. 2 shows two current switches each having two Schottky diodes. Depending upon the relative values of V1 and Vo, and V2 and Vo, the currents I1 and I2 are either steered towards or away from the load Ro. This arrangement allows abrupt transitions in the output voltage. However, a varying load Ro will produce varying delays and slight ringing in the output step. The output voltage Vo varies directly with the value of the output load Ro, for a given constant load current. This changing voltage changes the switching threshold value of the two diode switches. Thus, depending upon the load Ro, the output step is generated at various points along the input waveform, resulting in delay variations. Further, the capacitance of the diodes D2 and D4 coupled to the output load Ro results in a slight overshoot as the switching threshold is varied and more voltage is stored across the diodes in the reverse biased state.

What is desired is an output step generator which can produce an output step having nearly constant edge parameters regardless of the value of the load being driven.

SUMMARY OF THE INVENTION

In accordance with the present invention, a step generator having constant edge parameters while driving varying loads includes a pair of DC coupled low speed diode switches for slowly switching the output load current. A pair of capacitors provide an AC coupled high speed input for rapidly, but temporarily, switching the output load current until the sustaining action of the low speed diode switch has occurred. A pair of resistor divider circuits in each of the low speed diode switches maintains a relatively constant reverse bias voltage across the diodes coupled to the capacitors. In this way, the high speed switching threshold is maintained at a relatively constant level, and the output step is generated at the same point on the input, regardless of the value of the load resistance. In addition, the voltage across the capacitance of the reverse biased switching diodes remains constant, which eliminates variations in edge parameters.

BRIEF DESCRIPTION OF THE DRAWING

The sole FIGURE is a schematic diagram of a step generator according to the present invention.

DESCRIPTION OF THE PREFERRED EMBODIMENT

Referring to the SOLE FIGURE, an output step generator is shown having a first current I1 and a second current I2. These currents are of unequal magnitude and are generated in a conventional manner, usually by the collector of a transistor. The output load current delivered to the load resistor R11 is the difference between the two currents I1 and I2. The output load resistor may be external or internal to the circuit, and may be connected to ground or a reference voltage.

The output step generator includes a first low speed diode switch consisting of CR1, CR3, R7, R1, and transistor Q1, the base of which receives a low speed drive signal. A first high speed switch includes capacitor C1 which is coupled to a high speed drive signal. To form a differential input the output step generator includes a second low speed diode switch consisting of CR4, CR2, R2, R8, and transistor Q2, the base of which receives a low speed drive signal. A second high speed switch includes capacitor C2 which is coupled to a high speed drive signal.

In a first state, diodes CR1 and CR2 are off, and the output current is I1−I2. Diodes CR3 and CR4 are conductive. Resistor divider circuits R1 and R7, and R2 and R8, respectively, provide a measure of the output voltage at R11 to the cathode of CR1 and to the anode of CR2. If resistors R1 and R2 are chosen to be of a significantly higher value than resistors R7 and R8, for example a factor of ten or more, then the voltage at the cathode of CR1 and the anode of CR2 will incrementally follow the output voltage. Thus, the reverse biases across diodes CR1 and CR2 remain relatively constant and the high speed switching threshold is also constant.

In switching to a second stable state, diodes CR1 and CR2 become conductive, and diodes CR3 and CR4 turn off. The high speed drives coupled through capacitors C1 and C2 rapidly divert the output current from flowing through the load resistor R11 to diodes CR1 and CR2. However, the maximum time that the current can be absorbed is the time required to charge capacitors C1 and C2. After this amount of time, the low speed switching mechanism must turn on transistors Q1 and Q2 to sustain the step generator in the second state. Transistors Q1 and Q2 are shown having their basis coupled to respective low speed drives. The collectors form saturated current switches which provide the current path for I1 and I2 after capacitors C1 and C2 are completely charged. For the design to function properly, it is desirable for the transistors Q1 and Q2 to switch before the capacitors C1 and C2 have fully charged. The resultant voltage step at the output is thus (I1−I2) *R11.

After the required step duration has been achieved, the drive signals and the switching elements are returned to the initial conditions, and the output current is thus returned to the initial condition.

In any high speed circuit, it may be desirable to isolate circuit capacitance and provide proper termination in order to achieve maximum performance. Thus, resistor R5 in conjunction with capacitor C3, and resistor R6 in conjunction with capacitor C4, provide a proper termination for high speed switching transients. For proper operation, it is desirable to balance the values of capacitors C3 and C4. Resistors R3 and R4 are provided to isolate the capacitance of capacitors C3 and C4 from resistors R1, R7, and resistors R2, R8, respectively. Resistors R9 and R10 are provided to isolate the capacitance of capacitors C3 and C4 from the collector capacitance of transistors Q2 and Q1, respectively. The isolation of capacitors C3 and C4 helps to assure the balance in their values.

It should be noted that the constant edge parameters of the present invention are maintained with varying loads coupled to ground. However, the constant edge parameters are maintained even if the load resistor is coupled to a reference voltage, since the voltage across reverse biased diodes CR1 and CR2 is maintained at a relatively constant level. Also, due to the nature of the differential input of the present invention, ripples on the high and low speed drives produce opposite and equal currents at the output node which produce no voltage component.

While a preferred embodiment of the present invention has been shown and described, it will be apparent to those skilled in the art that many changes and modifications may be made without departing from the invention in its broader aspects. The appended claims are therefore intended to cover all such changes and modifications as fall within the true spirit and scope of the invention.

We claim:

1. An apparatus for producing an output voltage step comprising:
    (a) means for producing a first current;
    (b) means for producing a second current, the first and second currents being of opposite polarities and unequal magnitudes;
    (c) a load resistor;
    (d) first low speed switch means responsive to a first low speed control signal switchable between first and second voltage states for directing the first current through the load resistor when the first low speed control signal is in the first voltage state, and for preventing the first current from passing through the load resistor when the first low speed control signal is in the second voltage state, the first low speed switch means including a high speed switch terminal and means for providing a relatively constant switching threshold that is substantially insensitive to the value of the load resistor;
    (e) second low speed switch means responsive to a second low speed control signal switchable between first and second voltage states for directing the second current through the load resistor when the second low speed control signal is in the first voltage state, and for preventing the second current from passing through the load resistor when the second low speed control signal is in the second voltage state, the second low speed switch means including a high speed switch terminal and means for providing a relatively constant switching threshold that is substantially insensitive to the value of the load resistor;
    (f) first high speed switch means coupled to the high speed switch terminal of the first low speed switch means responsive to a first high speed control signal switchable between first and second voltage states for temporarily preventing the first current from passing through the load resistor when the first high speed control signal is switched between the second voltage state and the first voltage state; and
    (g) second high speed switch means coupled to the high speed switch terminal of the second low speed switch means responsive to a second high speed control signal switchable between first and second voltage states for temporarily preventing the second current from passing through the load resistor when the second high speed control signal is switched between the second voltage state and the first voltage state.

2. The apparatus according to claim 1 wherein said first low speed switch means comprises:
    a first diode having an anode and a cathode, said first diode being coupled in parallel with a first resistor;
    a second diode having an anode and a cathode, the anodes of the first and second diode being coupled together, the cathode of the second diode being coupled to the load resistor, and the first current being applied to the anodes of the first and second diodes;
    a second resistor being coupled between a first source of voltage and the cathode of the first diode; and
    transistor switch means having a control terminal and first and second controlled terminals, the control terminal receiving the first control signal, the first controlled terminal being coupled to the cathode of the first diode, and the second controlled terminal being coupled to a second source of voltage.

3. The apparatus according to claim 2 wherein said first high speed switch means comprises a capacitor having a first terminal and a second terminal, the first terminal receiving the first control signal and the second terminal being coupled to the cathode of the first diode.

4. The apparatus according to claim 2 wherein the value of the second resistor is significantly greater than the value of the first resistor.

5. The apparatus according to claim 1 wherein said second low speed switch means comprises:
    a third diode having an anode and a cathode, said third diode being coupled in parallel with a third resistor;
    a fourth diode having an anode and a cathode, the cathodes of the third and fourth diodes being coupled together, the anode of the fourth diode being coupled to the load resistor, and the second current being applied to the cathodes of the third and fourth diodes;
    a fourth resistor being coupled between a second source of voltage and the anode of the third diode; and
    transistor switch means having a control terminal and first and second controlled terminals, the control terminal receiving the second control signal, the first controlled terminal being coupled to the anode of the third diode, and the second controlled terminal being coupled to a first source of voltage.

6. The apparatus according to claim 5 wherein said second high speed switch means comprises a capacitor having a first terminal and a second terminal, the first terminal receiving the second control signal and the second terminal being coupled to the anode of the third diode.

7. The apparatus according to claim 5 wherein the value of the fourth resistor is significantly greater than the value of the third resistor.

* * * * *